(12) United States Patent
Nurmikko et al.

(10) Patent No.: US 6,233,267 B1
(45) Date of Patent: May 15, 2001

(54) BLUE/ULTRAVIOLET/GREEN VERTICAL CAVITY SURFACE EMITTING LASER EMPLOYING LATERAL EDGE OVERGROWTH (LEO) TECHNIQUE

(75) Inventors: Arto V Nurmikko, Providence, RI (US); Yoon-Kyu Song, Seoul (KR)

(73) Assignee: Brown University Research Foundation, Providence, RI (US)

( * ) Notice: Subject to any disclaimer, the term of this patent is extended or adjusted under 35 U.S.C. 154(b) by 0 days.

(21) Appl. No.: 09/233,006

(22) Filed: Jan. 19, 1999

Related U.S. Application Data

(60) Provisional application No. 60/072,058, filed on Jan. 21, 1998.

(51) Int. Cl.$^7$ ............................................. H01S 5/00
(52) U.S. Cl. .................................... 372/46; 372/45
(58) Field of Search ............................ 372/46, 96, 45

(56) References Cited

U.S. PATENT DOCUMENTS

| | | | |
|---|---|---|---|
| 5,146,465 | * 9/1992 | Khan et al. | 372/45 |
| 5,701,321 | * 12/1997 | Hayafuji et al. | 372/44 |
| 6,046,465 | * 4/2000 | Wang et al. | 257/98 |

OTHER PUBLICATIONS

Nam, Ok–Hyun et al., "Lateral epitaxy of low defect density GaN layers via organometallic vapor phase epitaxy", Appl. Phys. Lett. 71 (18), Nov. 3, 1997, pp. 2638–2640.

Jeon, H. et al., "Room–temperature optically pumped blue–green vertical cavity emitting laser", Appl. Phys. Lett. 67 (12), Sep. 18, 1995, pp. 1668–1670.

Song, Y–K. et al., "Gain characteristics of InGaN/GaN quantum well diode lasers" Appl. Phys. Lett., vol. 72, (12), Mar. 23, 1998, pp. 1418–1420.

Kelkar, P., "Excitons in a II–VI semiconductor microcavity in the strong–coupling regime", American Physical Society, Physical Review B, vol. 52, No. 8, Aug. 15, 1995, 4 pages pp. R5491–R5494.

* cited by examiner

Primary Examiner—Teresa M. Arroyo
Assistant Examiner—Quyen P. Leung
(74) Attorney, Agent, or Firm—Ohlandt, Greeley, Ruggiero & Perle, LLP

(57) ABSTRACT

A vertical cavity, surface emitting laser (VCSEL) device (10, 10') has a substrate (12) and, disposed over a surface of the substrate, a Group III nitride buffer layer (14) and a mesa structure containing at least a portion of an n-type Group III nitride layer (16). The VCSEL device and mesa structure further include a first multilayer dielectric mirror stack (18a), that is embedded within the first Group III nitride layer by the use of a lateral edge overgrowth (LEO) process; a p-type Group III nitride layer (26); and a p-n junction between the n-type Group III nitride layer and the p-type Group III nitride layer. The p-n junction contains an active multiquantum well region (24). Also contained in the mesa structure is a dielectric (silicon dioxide) layer (20) having a current constricting aperture (20a). The dielectric layer and aperture are buried within one of the n-type Group III nitride layer or the p-type Group III nitride layer, also by the use of the LEO process. A second multilayer dielectric mirror stack (18b) is disposed on top of the mesa structure and over the p-type Group III nitride layer. The first and second multilayer dielectric mirror stacks define a resonant optical cavity structure that passes through the aperture, and that supports an emission of less than 500 nm in the blue/green or NUV spectral regions.

18 Claims, 5 Drawing Sheets

BLUE/ULTRAVIOLET/GREEN VERTICAL CAVITY SURFACE EMITTING LASER EMPLOYING LATERAL EDGE OVERGROWTH (LEO) TECHNIQUE

CLAIM OF PRIORITY FROM A COPENDING PROVISIONAL PATENT APPLICATION

Priority is herewith claimed under 35 U.S.C. §119(e) from copending Provisional Patent Application No. 60/072,058, filed Jan. 21, 1998, entitled "BLUE/ULTRAVIOLET/ GREEN VERTICAL CAVITY SURFACE EMITTING LASER", by A. V. Nurmikko and Y-K Song. The disclosure of this Provisional Patent Application is incorporated by reference herein in its entirety.

FIELD OF THE INVENTION

This patent application relates generally to solid state laser devices and, in particular, to a method for fabricating a surface emitting short wavelength semiconductor solid state laser device (e.g., a semiconductor solid state laser device capable of operating in the blue, near ultraviolet (NUV), UV, blue-green or green region of the spectrum), as well as to a laser device fabricated in accordance with the method.

BACKGROUND OF THE INVENTION

Blue/NUV/green semiconductor lasers, based on both Group III-nitride and Group II-VI compound semiconductors, have been realized in a so-called edge emitting geometry, wherein continuous-wave room-temperature diode laser operation was achieved under electrical current injection. There has also been exploratory work that has led to the demonstration of a vertical cavity surface emitting laser (VCSEL), constructed with Group II-VI compounds, that operates under optical pumping. Reference in this regard can be had to a publication entitled "Room-temperature optically pumped blue-green vertical cavity emitting laser", Appl. Phys. Lett. 67 (12), Sep. 18, 1995, H. Jeon et al., pps. 1668–1670.

These device structures have shown that high quality dielectric mirrors can be implemented as the optical resonator in the blue spectrum for VCSEL structures.

OBJECTS AND ADVANTAGES OF THE INVENTION

It is a first object and advantage of this invention to provide an improved solid state vertical cavity surface emitting laser (VCSEL) device.

It is a second object and advantage of this invention to provide methods for fabricating a vertical cavity, surface emitting laser device capable of operation in the blue, near ultraviolet, ultraviolet, or blue-green or green regions of the optical spectrum, wherein the laser device constructed in accordance with the methods utilizes nitride-based semiconductor materials as the active medium.

It is another object and advantage of this invention to provide a solid state laser device that contains an embedded dielectric distributed Bragg reflector (DBR) mirror structure and that is fabricated using a lateral edge overgrowth (LEO) technique.

It is a further object and advantage of this invention to provide a solid state laser device that creates a confined current by aperture formation using the LEO technique, wherein the current constricting aperture may be placed either below or above an active quantum well optical gain medium.

SUMMARY OF THE INVENTION

The foregoing and other problems are overcome and the objects and advantages are realized by fabrication methods and solid state laser devices in accordance with embodiments of this invention.

Methods are herein described for fabricating a vertical cavity, surface emitting laser device capable of operation in the blue, near ultraviolet, ultraviolet, or blue-green or green regions of the optical spectrum. The laser device constructed in accordance with the methods utilizes nitride-based semiconductor materials as the active medium, and exploits their specific epitaxial crystal growth properties for shaping the electrical and optical energy flow paths. The laser device constructed in accordance with the methods of this invention also embeds high reflectivity dielectric optical mirrors in a monolithic manner within the device structure.

The teachings of this invention exploit recent advances in wide bandgap semiconductor materials, and in the optoelectronic area, to realize a novel type of blue/green and near ultraviolet (NUV) VCSEL device. In a presently preferred, but not limiting, embodiment of this invention the semiconductor materials are Group III nitrides, such as a combination of GaN, and its alloys with InN and AlN (for example, InGaN and AlGaN) having a demonstrated ability to emit light that spans the near ultraviolet, blue, and green parts of the spectrum. In general, the device emits light having a wavelength shorter than about 500 nm. Typically, the device will emit light having a wavelength generally in the range of about 250 nm to about 500 nm (e.g., UV through NUV through blue to green or blue-green).

In one aspect of this invention the laser device contains an embedded dielectric distributed Bragg reflector (DBR) mirror structure that is embedded using a lateral edge overgrowth (LEO) technique.

In another aspect of this invention the laser device creates an embedded confined current by aperture formation using the LEO technique. The current constricting aperture may be placed either below or above an active quantum well optical gain medium.

In one aspect then, this invention provides a vertical cavity, surface emitting laser (VCSEL) device having a substrate and, disposed over a surface of the substrate, a Group III nitride buffer layer and a mesa structure containing at least a portion of an n-type Group III nitride layer. The VCSEL device and mesa structure further include a first multilayer dielectric mirror stack, that is embedded within the first Group III nitride layer by the use of a lateral edge overgrowth (LEO) process; a p-type Group III nitride layer; and a p-n junction between the n-type Group III nitride layer and the p-type Group III nitride layer. The p-n junction contains an active multiquantum well region. Also contained in the mesa structure is a dielectric (silicon dioxide) layer having a current constricting aperture. The dielectric layer and aperture is buried within one of the n-type Group III nitride layer or the p-type Group III nitride layer, also by the use of the lateral edge overgrowth process. A second multilayer dielectric mirror stack is disposed on top of the mesa structure and over the p-type Group III nitride layer. The first and second multilayer dielectric mirror stacks define a resonant optical cavity structure that passes through the aperture. The resonant optical cavity structure supports an emission of about 500 nm or less in the green, blue/green, blue or NUV spectral regions. The VCSEL device further includes a first electrode that surrounds a base of the mesa structure and that is conductively coupled to the first Group III nitride layer, and a second electrode that is conductively coupled to the second Group III nitride layer. The placement of the n-type and p-type nitride layers could be reversed.

Methods for fabricating various embodiments of the VCSEL device, using the LEO process, are also disclosed.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

By way of introduction, the teachings of this invention are directed to a VCSEL capable of operation at a desired wavelength in the range of about 250 nm to about 500 nm. The 500 nm wavelength may be referred to as blue-green, or green-blue, or even as green. Generally, a wavelength of 480 nm is considered as being blue, while a wavelength of 400 nm is considered as deep blue. A wavelength of 350 nm may be considered as being in the near ultraviolet (NUV) region, while 250 nm is typically considered as lying in the UV. It should be clear at the outset that the teachings of this invention are not to be limited in any sense by semantics as to the name of a particular "color" of an emission wavelength, and any references to specific colors below is made strictly for convenience.

Further by way of introduction, the lateral edge overgrowth (LEO) technique (also referred to in the literature by the equivalent acronyms ELO, or ELOG) is known to allow the growth of high quality, defect-free nitride compounds, especially when using selective area masking of the growth GaN surface with silicon dioxide in a chemical metalo-organic vapor deposition process (MOCVD). Reference in this regard can be had to a publication entitled "Lateral Epitaxy of Low Defect Density GaN Layers via Organometallic Vapor Phase Epitaxy", O.-H Nam et al., Appl. Phys. Lett. 71, 2638 (1997). In this process it has been found that the crystal growth nucleated on a GaN layer through an aperture in $SiO_2$ acquires a large lateral component, the consequence of which is the deposition of defect-free crystal material on the $SiO_2$ mask itself.

By way of example, in accordance with the reported Nam et al. approach the lateral overgrowth of GaN on $SiO_2$ was achieved at 1000–1100° C. at 45 Torr. Triethylgallium (13–39 $\mu$mol/min) and $NH_3$ (1500 sccm) precursors were used in combination with a 3000 sccm $H_2$ dilutent.

The inventors have realized that a $SiO_2$ layer is itself an important component in the fabrication of high reflectivity DBR mirrors that are required as part of a vertical cavity laser structure. Furthermore, the inventors have realized that, as an electrical insulating material, a $SiO_2$ layer can be used to constrict and direct current flow in the device. This makes it possible to direct the electrical current from external contacts into a semiconducting pn-junction and an active quantum well (AQW) region, without hindrance from electrically insulating DBR laser mirrors.

Figure 1A:
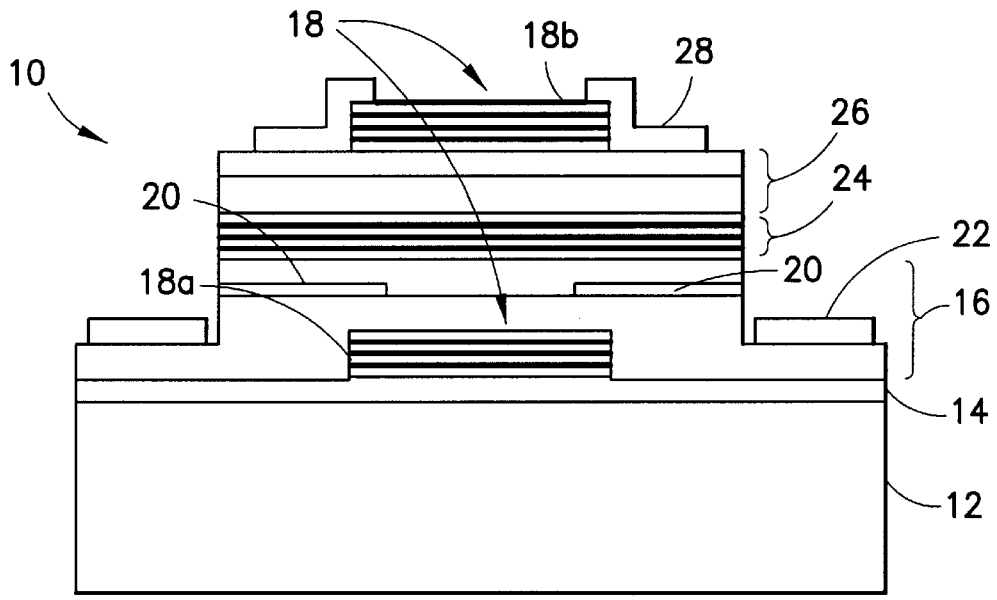
FIG. 1A is an enlarged, cross-sectional view of a Group III-nitride based VCSEL in accordance with a first embodiment of this invention, wherein a current blocking aperture layer is disposed between a pair of distributed Bragg reflector (DBR) mirror structures and below (i.e., nearer to the substrate) an active quantum well gain medium.
Figure 1B:
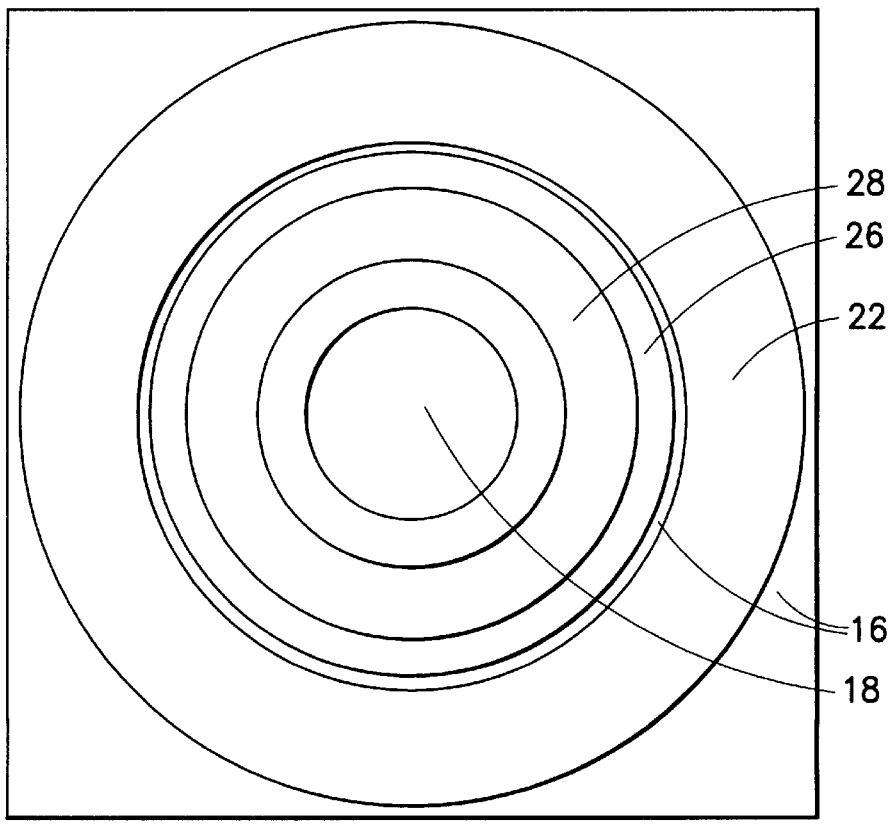
FIG. 1B is an enlarged, top view of the VCSEL of FIG. 1A.

Referring to FIGS. 1A and 1B, a vertical cavity laser 10 in accordance with a first embodiment of this invention is comprised of the following layers and materials. The various materials and layer thicknesses and diameters given below should be viewed as being exemplary, and are not to be construed in a limiting sense upon the teachings and practice of this invention.

A bottom-most layer is a substrate 12 having any suitable thickness and that is comprised of any suitable electrically insulating material. Specific examples of suitable materials are sapphire, SiC, or GaN. A buffer layer 14 is disposed over a top, major surface of the substrate 12. The buffer layer has a thickness of 2 micrometers and may be comprised of GaN, AlGaN, or AlN. An n-type nitride layer 16 is disposed over the buffer layer 14 and has a thickness in the range of 3 micrometers to 4 micrometers. Suitable Group III nitride materials are AlGaN, AlN, AlInGaN, InN, or GaN and their alloys. The n-type nitride layer 16 contains an embedded first multilayered DBR laser mirror 18a which has a total thickness in the range of 1 micrometer to 2 micrometers and a diameter of about 8 micrometers.

In a presently preferred embodiment (for an example of a device operating in the blue wavelength regime) the multi-layered DBR laser mirror 18a is comprised of a total of n alternating layers of $SiO_2$ and $HfO_2$, each having a thickness of about 500 Angstroms, where n is typically greater than 10, and is preferably in the range of about 15 to 20.

In this embodiment of the invention an apertured current constricting or blocking layer 20 is also contained and embedded within the n-type nitride layer 16. The current blocking layer 20 has a thickness of 1000 Angstroms and is comprised of $SiO_2$ or $Si_3N_4$.

Over the n-type nitride layer 16, specifically on stepped mesa sidewalls thereof, is a bottom electrode 22 comprised of any suitable electrically conductive electrode material or materials. When seen from above the bottom electrode 22 forms an annular ring-shaped structure having an inner diameter of 30 micrometers and an outer diameter of 50 micrometers. The bottom electrode 22 provides an electrically conductive connection to the n-type nitride layer 16, and the preferred contact metallization is Ni, Ti and similar metals that have been demonstrated to provide a good ohmic contact to n-type nitride materials. Also over the n-type nitride layer 16, specifically a top surface thereof, is an active quantum well (AQW) gain medium layer 24. The AQW gain medium layer 24 has a representative total thickness of about 0.3 micrometers, and may be comprised of InGaN, GaN, or AlGaN.

In a presently preferred embodiment the multi-layered AQW gain medium layer 24 is comprised of GaN, InGaN, and AlGaN in such a way that a smaller band gap of these materials forms the quantum well, bounded by a wider band gap material. The gain medium may be comprised of 3 to 10 such layer pairs, where the thickness of the smaller band gap material layer is approximately 50 Angstroms and that of the wider band gap material approximately 100 Angstroms.

Over the AQW gain medium layer 24 is a p-type nitride layer 26, which forms a p-n junction in combination with the n-type nitride layer 16. The p-type nitride layer 26 has a thickness of 0.5 micrometers, a diameter of 24 micrometers, and may be comprised of AlGaN, AlN, AlInGaN, or GaN and their alloys. Over the p-type nitride layer 26 is a second multi-layered DBR laser mirror 18b which also has a total thickness in the range of 1 micrometer to 2 micrometers and a diameter of 8 micrometers. A top electrode 28 provides an electrically conductive connection to the p-type nitride layer 26. The top electrode 28 has an inner diameter of 5 micrometers and an outer diameter of 18 micrometers. The preferred metallization for the top electrode 28 is a combination of Ni and Au, which are thermally annealed after their deposition in order to establish an ohmic contact.

Figure 2A:
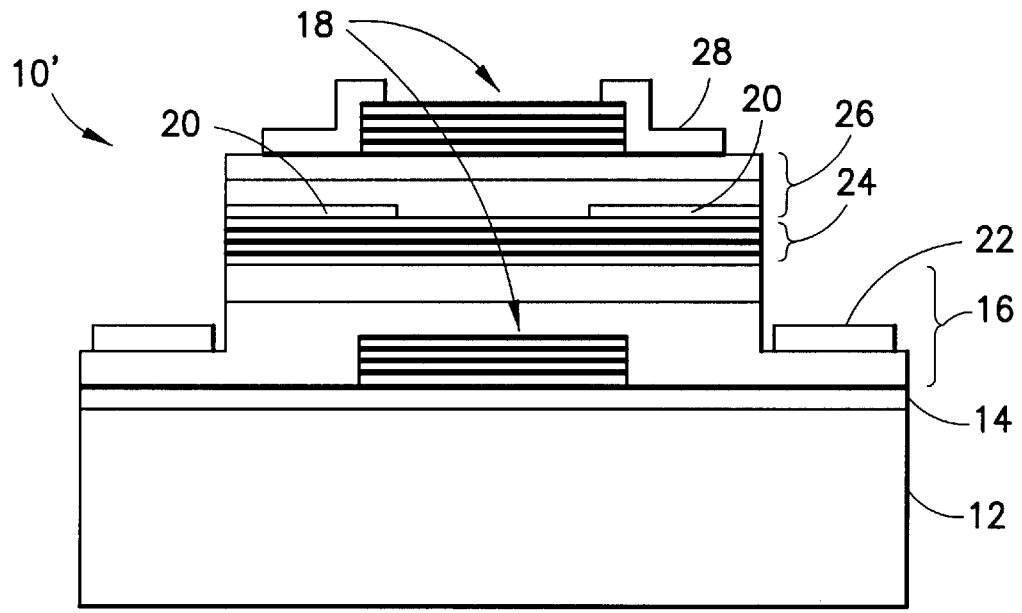
FIG. 2A is an enlarged, cross-sectional view of a Group III-nitride based VCSEL in accordance with a second embodiment of this invention, wherein the current blocking aperture layer is disposed between the pair of distributed Bragg reflector (DBR) mirror structures and above the active quantum well gain medium.
Figure 2B:
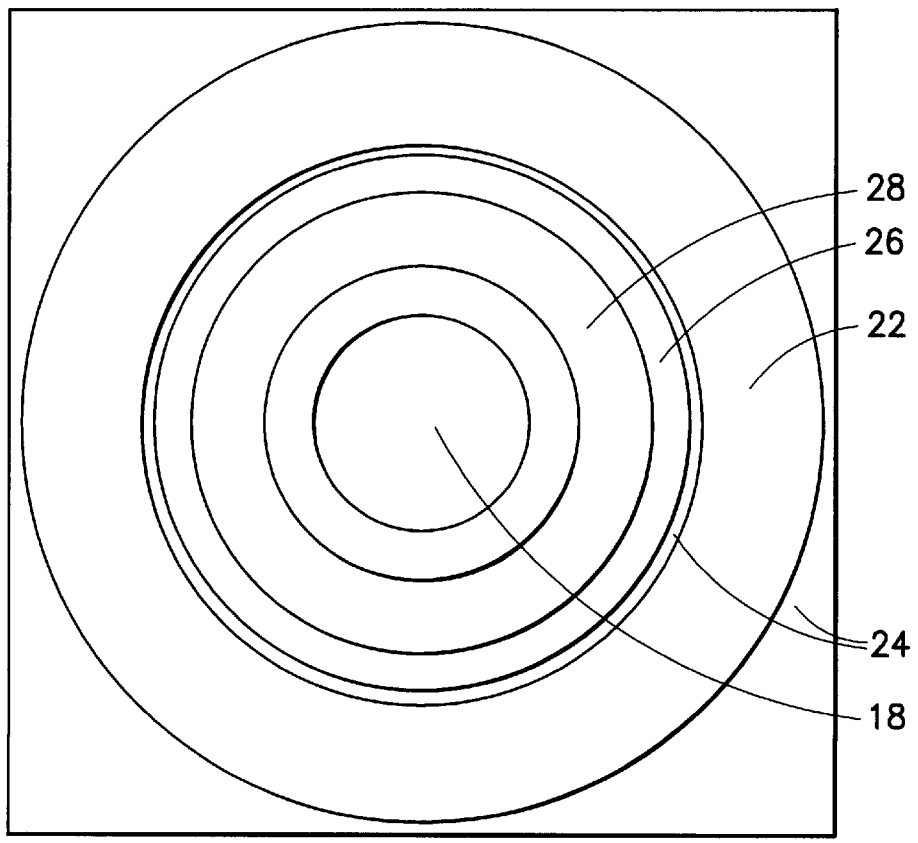
FIG. 2B is an enlarged, top view of the VCSEL of FIG. 2A.

Referring to FIGS. 2A and 2B, a vertical cavity laser 10' in accordance with a second embodiment of this invention differs from the embodiment of FIGS. 1A and 1B in the placement of the apertured current constricting or blocking layer 20. Instead of being contained within the n-type nitride layer 16, the current blocking layer 20 is disposed over the AQW gain medium structure 22, and is contained within the p-type nitride layer 26. As in the embodiment of FIGS. 1A and 1B, the current blocking layer 20 may have a thickness of 1000 Angstroms and may be comprised of $SiO_2$ or $Si_3N_4$.

It should be noted that the positions n-type and p-type layers could be reversed. It should be further noted that a typical dopant for n-nitrides is silicon (Si), and a typical dopant for p-nitrides is magnesium (Mg).

Figure 3A:
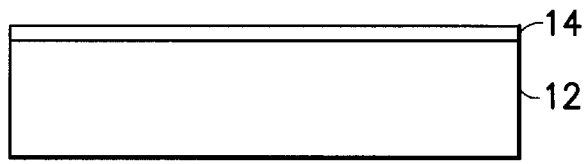
FIGS. 3A–3L are each an enlarged, cross-sectional view of the VCSEL of FIGS. 1A and 2A at various stages of the fabrication process, and are useful in explaining the presently preferred VCSEL fabrication methods.
Figure 3B:
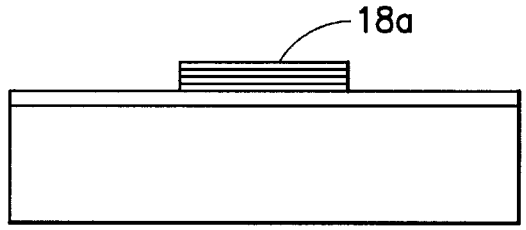
Figure 3C:
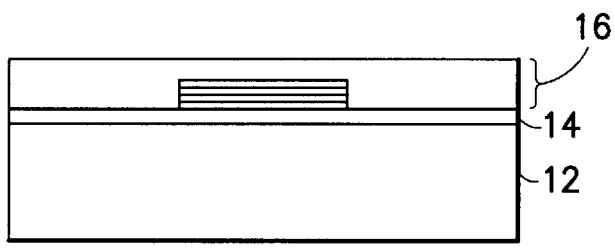
Figure 3D:
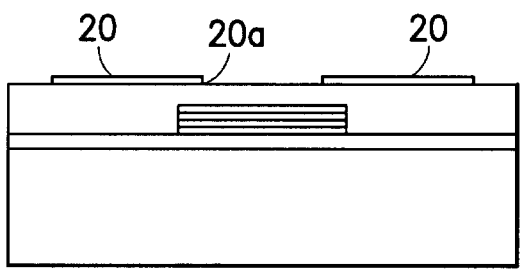
Figure 3E:
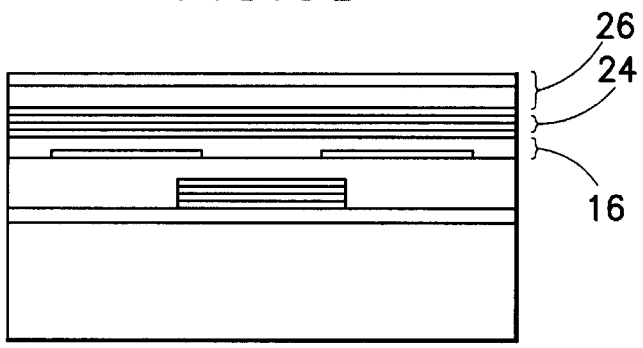
Figure 3F:
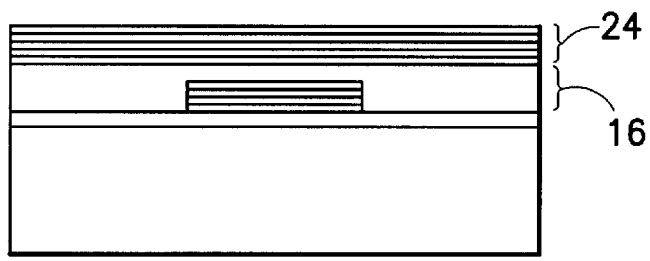
Figure 3G:
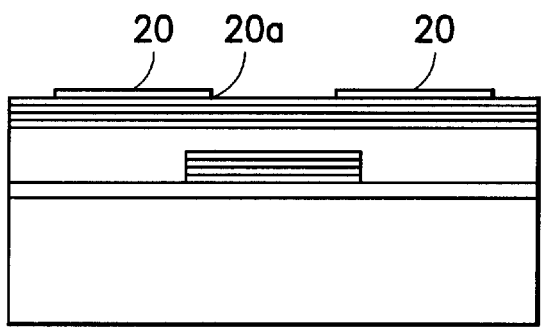
Figure 3H:
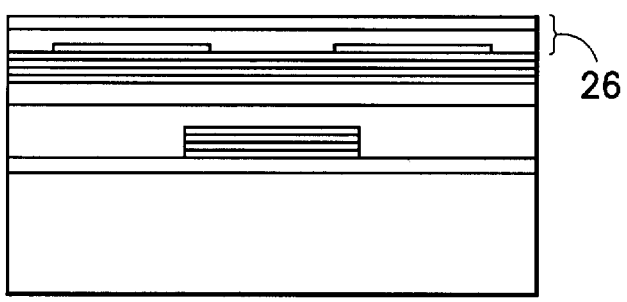

FIGS. 3A–3L depict various method steps in the fabrication of the VCSEL embodiments of FIGS. 1A and 2A. As will be made apparent, the illustrated steps include both possibilities for the placement of the current constricting aperture 20. Specifically, the steps illustrated in FIGS. 3C–3E are used to form the embodiment of FIG. 1A, and not the steps 3F–3H, while the steps illustrated in FIGS. 3F–3H are used to form the embodiment of FIG. 2A, and not the steps 3C–3E.

FIG. 3A: The growth of AlN, GaN, AlGaN, or combinations thereof, is performed to provide the buffer layer 14 on the sapphire, silicon carbide, or GaN substrate 12.

FIG. 3B: This step entails the deposition of the bottom multilayer high reflectivity DBR mirror 18a by a vacuum evaporative technique. The DBR mirror 18a is comprised of a low loss quarter-wave thick dielectric pair of materials suitable for VCSEL mirrors generally in the blue/NUV/green wavelength range. Suitable materials are $SiO_2/HfO_2$ (silicon dioxide/hafnium dioxide), $SiO_2/TiO_2$ (silicon dioxide/titanium dioxide), or $SiO_2/MgO_2$ (silicon dioxide/magnesium dioxide) or comparable materials. After planar deposition the DBR mirror 18a is patterned by standard lithographic techniques and either dry or wet etched by standard techniques. For example, the inventors have employed argon-ion milling as a means to define micrometer scale features onto $SiO_2/HfO_2$ and $SiO_2/TiO_2$ DBR mirrors. The argon-ion milling procedure can be used to define the lateral patterning of the DBR mirrors on a micrometer scale (typical range of lateral dimensions is 3–10 micrometers). In addition to argon-ion milling, the inventors have also determined that wet chemical etching techniques can be used to achieve the same results.

FIG. 3C: This step, used to form the embodiment of FIG. 1A, uses the lateral edge overgrowth (LEO) technique to synthesize a portion of the layer 16 of n-type GaN or its alloys, as demonstrated by growth on patterned $SiO_2$ films. The result of the execution of this step is a planar crystal surface on the n-type nitride, with the lower or bottom DBR mirror 18a buried in the n-type nitride layer 16. This is preferably accomplished using the above-referenced chemical metalo-organic vapor deposition process (MOCVD) so as to provide the high quality epitaxial n-type nitride layer that completely buries the DBR mirror structure 18a.

It should be noted that the use of the presently preferred LEO technique results in a planarized surface, after the DBR mirror 18a is buried and the epitaxial growth continues for some duration of time. This ability to produce a planar surface is an important aspect of the use of the LEO approach in this invention, as the surface covering the DBRs is a planar surface enabling further growth steps to take place.

FIG. 3D: This step provides a deposition of a $SiO_2$, $Si_3N_4$ or comparable dielectric planar thin film by evaporative techniques. The $SiO_2$ layer 20 is next subjected to standard lithographic patterning and etching techniques and selected areas of material are removed so as to define an aperture or window 20a immediately above the bottom DBR 18a. The diameter of the window 20a is comparable to or smaller than the diameter of the DBR mirror 18a (e.g., 8 micrometers). The purpose of the patterned $SiO_2$ layer 20 is to define a constriction of current flow that is in alignment with the optical path in the completed laser device 10.

FIG. 3E: A second lateral edge overgrowth (LEO) is next performed to provide the remainder of the n-type nitride layer 16, followed by a planar multiple layer sequence of GaN and its alloys that define the AQW region 24 as well as a pn-junction between the n-type nitride layer 16 and the later deposited p-type nitride layer 24. The design of the AQW from smaller bandgap nitride material may be based on the same principles as employed in the edge emitting diode lasers, and may as well include known considerations for a separate confinement heterostructure (SCH).

The actual choice of the smaller band gap material in the AQW region 24, together with its thickness, determines the wavelength of operation of the laser device 10. Typically in the blue to blue-green or green region, for example about 400–500 nm, the material would be InGaN. In this alloy (as with the others), it is the composition ratio between the In and Ga elements that determines the actual band gap. This ratio is a design parameter. The band gap of the layers surrounding the smaller band gap material (the definition of a quantum well) is made large enough to induce the electrons and holes (which are the electronic excitations that give off the light) to be confined in the well. AlGaN is typically used, where the fraction of aluminum ranges from zero (GaN limit) to 50%.

As was mentioned above, a planarization will occur automatically via the LEO process. As such, burying the $SiO_2$ aperture layer 20 does not compromise the desired optical flatness of the laser structure.

FIG. 3F: This step is used to form the embodiment of FIG. 2A, and is performed, with the steps shown in FIGS. 3G and 3H, in lieu of the steps shown in FIGS. 3C, 3D and 3E. In FIG. 3F the method applies the lateral edge overgrowth (LEO) technique to synthesize the layer 16 of n-type GaN or its alloys, resulting in a planar crystal surface with the bottom DBR mirror 18a buried in it. This is followed by the fabrication of the planar, multiple layer sequence of GaN and its alloys that define the AQW region 24, as well as the pn-junction between the n-type nitride layer 16 and the later deposited p-type nitride layer 24. As in the first embodiment, the design of the AQW from smaller bandgap nitride material may be based on the same principles as employed in the edge emitting diode lasers, and may as well include known considerations for a separate confinement heterostructure (SCH).

FIG. 3G: This step provides the deposition of a $SiO_2$, $Si_3N_4$ or comparable dielectric planar thin film by evaporative techniques onto the AQW structure 24. The $SiO_2$ layer 20 is subjected to standard lithographic patterning and etching techniques and selected areas of material are removed so as to define the current constricting aperture or window 20a above and in registration with the bottom DBR 18a. As in the first embodiment, the diameter of the window 20a is comparable to or smaller than the diameter of the DBR mirror 18a (e.g., 8 micrometers).

FIG. 3H: A second lateral edge overgrowth (LEO) is next performed to provide the p-type nitride layer 26, with the current constricting windowed layer 20 contained within it. At this point the device resembles either the one shown in FIG. 3E, for the first embodiment, or the one shown in FIG. 3H, for the second embodiment. In either case, the top surface of the p-type nitride layer 26 is exposed and is ready for further processing. The description of FIGS. 3I–3L shows the first VCSEL embodiment 10 of FIG. 1A (the current constricting aperture or window 20a is located below the AQW structure 24). However, it should be realized that the second VCSEL embodiment 10' of FIG. 2A could have been shown as well.

Figure 3I:
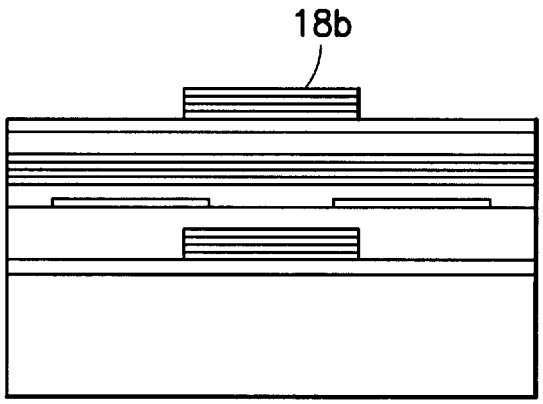
Figure 3J:
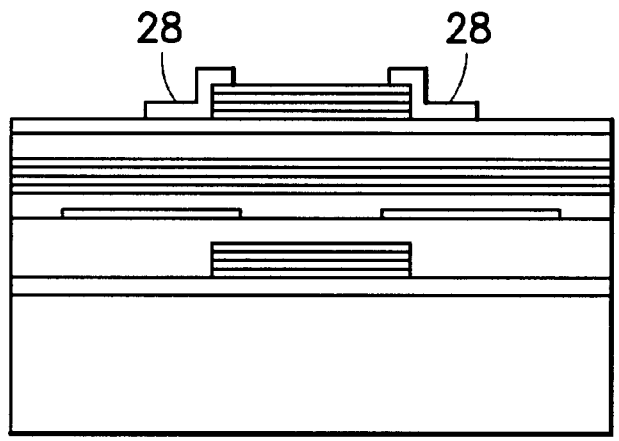

FIG. 3I: By employing techniques and materials referred to above with respect to FIG. 3B, the second DBR mirror 18b is deposited and laterally patterned and aligned, matching in size and centered on the bottom DBR mirror 18a as well as the current constricting aperture 20a within the layer 20.

FIG. 3H: This step involves the contact metallization to the p-type top layers, GaN, AlN, InN and their alloys. The pattern of metallization is defined by established lithographic techniques and applied by evaporative techniques in a guard-ring geometry, centered with respect to the open aperture at the top DBR mirror 18b. The preferred metallization involves a combination of Ni and Au, which are thermally annealed after their deposition in order to establish an ohmic contact.

Figure 3K:
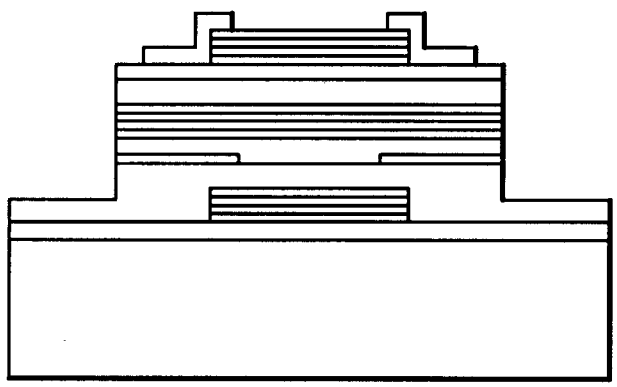

FIG. 3K: Prior to making an electrical contact to the n-type nitride material layer 16, a mesa etching step is performed by which a generally circular cylindrical, pillar-like structure is created. The pillar-like structure is centered with respect to the DBR mirrors 18a and 18b and the current constricting aperture 20a. The mesa diameter may range from about one micrometer up to hundred of micrometers. The mesa is prepared by employing standard lithographic patterning and alignment techniques in combination with known types of dry and/or wet etching processes. The etch depth is chosen such that the n-type lower nitride layer 16 (i.e., the n-type cladding layer of the separate confinement heterostructure (SCH)) is exposed.

Figure 3L:
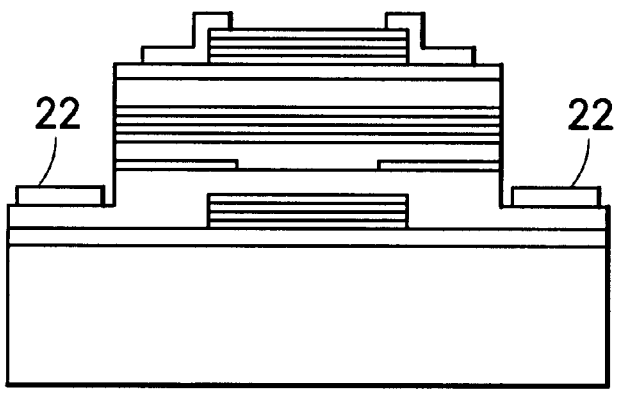

FIG. 3L: In this step contact metallization is applied by an evaporative technique to the exposed horizontally-disposed surface of the n-type nitride layer 16. The preferred contact metallization is Ni, Ti and similar metals that have been demonstrated to provide a good ohmic contact to the n-type nitride materials. The placement of the contact metallization to form the lower electrode 22 is achieved by employing standard lithographic patterning and alignment techniques to define an annular guard ring that also defines the outer perimeter of the now completed VCSEL device 10 or 10'.

In general, the lower electrode 22 and the upper electrode 28 each have a generally annular, ring-like shape, and the lower electrode 28 is disposed on a stepped mesa sidewall for being conductively coupled to the n-type Group III nitride layer 16.

As was stated previously, the various disclosed materials, thicknesses, dimensions and the like are exemplary of the practice of this invention, and are not intended to be construed in a limiting sense upon the practice of this invention.

Also, certain method steps may be executed in other than the disclosed order, while still obtaining the desired result. By example, the selective removal of material to form the mesa structure (the step of FIG. 3K) could be performed just prior to the step shown in FIG. 3I, or just prior to the step shown in FIG. 3J. Also, and as was stated previously, one can reverse the positions of the p-type and n-type nitride layers.

The long wavelength end range for devices fabricated in accordance with this invention is envisioned as being about 500 nm. It is known that edge emitting InGaN QW lasers have been operated at wavelengths as short as about 400 nm in the deep blue (at which point InGaN ceases to be useful). There is a drive towards even shorter wavelengths, perhaps eventually reaching 250 nm in the ultraviolet (UV). The teachings of this invention are expected to remain valid in the range of at least approximately 250–500 nm. In the UV region, the preferred materials would be AlGaN both for the quantum well and the adjacent "cladding" layers in the AQW region 24, with different Al composition, respectively.

The AQW design primarily determines the wavelength setting of the device. The choice of the DBR layer thicknesses can then be determined.

Thus, while the invention has been particularly shown and described with respect to preferred embodiments thereof, it will be understood by those skilled in the art that changes in form and details may be made therein without departing from the scope and spirit of the invention.

What is claimed is:

1. A vertical cavity, surface emitting laser (VCSEL) device comprising a substrate and, disposed over a surface of said substrate, a first Group III nitride layer having a first electrical conductivity; a first multilayer mirror structure embedded within said first Group III nitride layer; a second Group III nitride layer having a second electrical conductivity opposite the first electrical conductivity; a junction between said first and second Group III nitride layers, said junction comprising a quantum well region; a current constricting aperture embedded within one of said first Group III nitride layer or said second Group III nitride layer; a second multilayer mirror structure disposed over said second Group III nitride layer, wherein said first and second multilayer mirror structures define a resonant optical cavity structure that passes through said aperture; a first electrode that is conductively coupled to said first Group III nitride layer; and a second electrode that is conductively coupled to said second Group III nitride layer.

2. A VCSEL device as in claim 1, and further comprising a Group III nitride buffer layer interposed between said surface of said substrate and said first Group III nitride layer.

3. A VCSEL device as in claim 1, wherein said first type of electrical conductivity is n-type, and wherein said second type of electrical conductivity is p-type.

4. A VCSEL device as in claim 1, wherein said first electrode and said second electrode each have a generally annular shape, and wherein said first electrode is disposed on a stepped mesa sidewall for being conductively coupled to said first Group III nitride layer, said first electrode surrounding said mesa which has a generally circular cylindrical shape.

5. A VCSEL device as in claim 1, wherein said current constricting aperture is located within a dielectric layer that is disposed between said first multilayer mirror structure and said quantum well region within said first Group III nitride layer.

6. A VCSEL device as in claim 1, wherein said current constricting aperture is located within a dielectric layer that is disposed between said second multilayer mirror structure and said quantum well region within said second Group III nitride layer.

7. A VCSEL device as in claim 1, wherein said current constricting aperture is located within a dielectric layer comprised of silicon dioxide, wherein said dielectric layer is disposed between said first multilayer mirror structure and said quantum well region within said first Group III nitride layer, and wherein said first Group III nitride layer is formed by a lateral edge overgrowth process.

8. A VCSEL device as in claim 1, wherein said current constricting aperture is located within a dielectric layer comprised of silicon dioxide, wherein said dielectric layer is disposed between said second multilayer mirror structure and said quantum well region within said second Group III nitride layer, and wherein said second Group III nitride layer is formed by a lateral edge overgrowth process.

9. A method for fabricating a vertical cavity, surface emitting laser (VCSEL) device, comprising steps of:

providing a substrate;

forming a portion of a first Group III nitride layer, having a first electrical conductivity, over a surface of said substrate;

fabricating a first dielectric multilayer mirror structure upon a surface of said portion of said first Group III nitride layer;

burying said first multilayer mirror structure by forming a further portion of said first Group III nitride layer by the use of a lateral edge overgrowth process;

forming a dielectric layer having a current constricting aperture upon a surface of said further portion of said first Group III nitride layer, said aperture being in registration with said first dielectric multilayer mirror structure;

burying said dielectric layer by forming a remaining portion of said first Group III nitride layer by the use of the lateral edge overgrowth process;

fabricating a multiquantum well region over said first Group III nitride layer;

forming a second Group III nitride layer having a second electrical conductivity opposite the first electrical conductivity over the multiquantum well region, wherein a junction between said first and second Group III nitride layers comprises said multiquantum well region;

fabricating a second multilayer mirror structure over said second Group III nitride layer, said second multilayer mirror structure being in registration with said first dielectric multilayer mirror structure and said current constricting aperture defining a resonant optical cavity structure with said first multilayer mirror structure;

selectively removing material to form a mesa structure that contains a part of said first Group III nitride layer, said current constricting aperture, said multiquantum well region, and said second Group III nitride layer; and applying a first electrode that is conductively coupled to said first Group III nitride layer and a second electrode that is conductively coupled to said second Group III nitride layer.

10. A method as in claim 9, wherein the step of providing a substrate includes a step of growing a Group III nitride buffer layer on said surface of said substrate.

11. A method as in claim 9, wherein said first type of electrical conductivity is n-type, and wherein said second type of electrical conductivity is p-type.

12. A method as in claim 9, wherein said first electrode and said second electrode each have a generally annular shape, and wherein said first electrode is disposed on a stepped mesa sidewall for being conductively coupled to said first Group III nitride layer, said first electrode surrounding said mesa structure which has a generally circular cylindrical shape.

13. A method for fabricating a vertical cavity, surface emitting laser (VCSEL) device, comprising steps of:

providing a substrate;

forming a portion of a first Group III nitride layer, having a first electrical conductivity, over a surface of said substrate;

fabricating a first dielectric multilayer mirror structure upon a surface of said portion of said first Group III nitride layer;

burying said first multilayer mirror structure by forming a remaining portion of said first Group III nitride layer by the use of a lateral edge overgrowth process;

fabricating a multiquantum well region over said first Group III nitride layer;

forming a dielectric layer having a current constricting aperture over said multiquantum well region, said aperture being in registration with said first dielectric multilayer mirror structure;

burying said dielectric layer by forming a second Group III nitride layer, having a second electrical conductivity opposite the first electrical conductivity, by the use of the lateral edge overgrowth process, wherein a junction between said first and second Group III nitride layers comprises said multiquantum well region;

fabricating a second multilayer mirror structure over said second Group III nitride layer, said second multilayer mirror structure being in registration with said first dielectric multilayer mirror structure and said current constricting aperture defining a resonant optical cavity structure with said first multilayer mirror structure;

selectively removing material to form a mesa structure that contains a part of said first Group III nitride layer, said current constricting aperture, said multiquantum well region, and said second Group III nitride layer; and applying a first electrode that is conductively coupled to said first Group III nitride layer and a second electrode that is conductively coupled to said second Group III nitride layer.

14. A method as in claim 13, wherein the step of providing a substrate includes a step of growing a Group III nitride buffer layer on said surface of said substrate.

15. A method as in claim 13, wherein said first type of electrical conductivity is n-type, and wherein said second type of electrical conductivity is p-type.

16. A method as in claim 13, wherein said first electrode and said second electrode each have a generally annular shape, and wherein said first electrode is disposed on a stepped mesa sidewall for being conductively coupled to said first Group III nitride layer, said first electrode surrounding said mesa structure which has a generally circular cylindrical shape.

17. A vertical cavity, surface emitting laser (VCSEL) device comprising a substrate and, disposed over a surface of said substrate, a Group III nitride buffer layer and a mesa structure containing at least a portion of an n-type Group III nitride layer; a first multilayer dielectric mirror stack embedded within said first Group III nitride layer; a p-type Group III nitride layer; a p-n junction between said n-type Group III nitride layer and said p-type Group III nitride layer, said p-n junction comprising an active multiquantum well region; a dielectric layer containing a current constricting aperture buried within one of said n-type Group III nitride layer or said p-type Group III nitride layer by the use of a lateral edge overgrowth process; wherein there is a second multilayer dielectric mirror stack disposed on top of said mesa structure and over said p-type Group III nitride layer, wherein said first and second multilayer dielectric mirror stacks define a resonant optical cavity structure that passes through said aperture, said resonant optical cavity structure for supporting an emission of less than about 500 nm; a first electrode that surrounds a base of said mesa structure and that is conductively coupled to said first Group III nitride layer; and a second electrode that is conductively coupled to said second Group III nitride layer.

18. A vertical cavity, surface emitting laser (VCSEL) device comprising a substrate and, disposed over a surface of said substrate, a Group III nitride buffer layer and a mesa structure containing at least a portion of an p-type Group III nitride layer; a first multilayer dielectric mirror stack embedded within said first Group III nitride layer; an n-type Group III nitride layer; a p-n junction between said n-type Group III nitride layer and said p-type Group III nitride layer, said p-n junction comprising an active multiquantum well region; a dielectric layer containing a current constricting aperture buried within one of said n-type Group III nitride layer or said p-type Group III nitride layer by the use of a lateral edge overgrowth process; wherein there is a second multilayer dielectric mirror stack disposed on top of said mesa structure and over said n-type Group III nitride layer, wherein said first and second multilayer dielectric mirror stacks define a resonant optical cavity structure that passes through said aperture, said resonant optical cavity structure for supporting an emission of less than about 500 nm; a first electrode that surrounds a base of said mesa structure and that is conductively coupled to said first Group III nitride layer; and a second electrode that is conductively coupled to said second Group III nitride layer.

* * * * *